US010867783B2

(12) United States Patent
Razek

(10) Patent No.: US 10,867,783 B2
(45) Date of Patent: Dec. 15, 2020

(54) METHOD AND DEVICE FOR THE SURFACE TREATMENT OF SUBSTRATES

(71) Applicant: EV Group E. Thallner GmbH, St. Florian am Inn (AT)

(72) Inventor: Nasser Razek, Scharding (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 116 days.

(21) Appl. No.: 15/919,372

(22) Filed: Mar. 13, 2018

(65) Prior Publication Data
US 2018/0204717 A1  Jul. 19, 2018

Related U.S. Application Data

(63) Continuation of application No. 15/122,943, filed as application No. PCT/EP2014/056545 on Apr. 1, 2014, now Pat. No. 9,960,030.

(51) Int. Cl.
*H01L 21/02* (2006.01)
*H01L 21/67* (2006.01)
(Continued)

(52) U.S. Cl.
CPC ...... *H01L 21/02046* (2013.01); *C23C 14/022* (2013.01); *C23C 16/50* (2013.01);
(Continued)

(58) Field of Classification Search
None
See application file for complete search history.

(56) References Cited

U.S. PATENT DOCUMENTS 6,319,842 B1  11/2001  Khosla et al.
8,052,799 B2  11/2011  Cooney, III et al.
(Continued)

FOREIGN PATENT DOCUMENTS

AT        405775 B    11/1999
CN    101957554 A     1/2011
(Continued)

OTHER PUBLICATIONS

Machine-generated English translation of JP S61-160938, total pages 4.*
(Continued)

*Primary Examiner* — Bo B Jang
(74) *Attorney, Agent, or Firm* — Kusner & Jaffe

(57) ABSTRACT

A method for the surface treatment of a substrate surface of a substrate includes arranging the substrate surface in a process chamber, bombarding the substrate surface with an ion beam, generated by an ion beam source and aimed at the substrate surface, to remove impurities from the substrate surface, whereby the ion beam has a first component, and introducing a second component into the process chamber to bind the removed impurities. A device for the surface treatment of a substrate surface of a substrate includes a process chamber for receiving the substrate, an ion beam source for generating an ion beam that has a first component and is aimed at the substrate surface to remove impurities from the substrate surface, and means to introduce a second component into the process chamber to bind the removed impurities.

6 Claims, 6 Drawing Sheets

(51) Int. Cl.
C23C 14/02 (2006.01)
C23C 16/50 (2006.01)
H01J 37/32 (2006.01)

(52) U.S. Cl.
CPC .. *H01J 37/32009* (2013.01); *H01L 21/67028* (2013.01); *H01J 2237/08* (2013.01); *H01J 2237/3137* (2013.01); *H01J 2237/3151* (2013.01)

(56) References Cited

U.S. PATENT DOCUMENTS

| 2002/0088476 | A1 | 7/2002 | Cowley et al. |
| 2005/0230697 | A1 | 10/2005 | Kwon et al. |
| 2006/0017011 | A1 | 1/2006 | Shang |
| 2008/0093212 | A1 | 4/2008 | Cooney et al. |
| 2009/0032056 | A1 | 2/2009 | Tsunekawa |
| 2010/0116984 | A1 | 5/2010 | Ogawa et al. |

FOREIGN PATENT DOCUMENTS

| DE | 10048374 | A1 | 4/2001 |
| DE | 10210253 | A1 | 10/2003 |
| JP | 6187338 | | 5/1986 |
| JP | 61160938 | | 7/1986 |
| JP | S61-160938 | A | 7/1986 |
| JP | S6423538 | A | 1/1989 |
| JP | 2002527902 | A | 8/2002 |
| JP | 2005-311285 | A | 11/2005 |
| JP | 2009-038295 | A | 2/2009 |
| JP | 2012142584 | A | 7/2012 |
| WO | WO-2002/063661 | A2 | 8/2002 |
| WO | WO-2008/142584 | A1 | 11/2008 |
| WO | WO-2014/154272 | A1 | 10/2014 |
| WO | WO-2014/202106 | A1 | 12/2014 |
| WO | WO-2015/082020 | A1 | 6/2015 |

OTHER PUBLICATIONS

Chlorine—Britannica Online Encyclopedia, total pages 3.*
International Search Report from corresponding International Patent Application No. PCT/EP2014/056545, dated Aug. 21, 2014.
Takasaki et al., "Si surface study after Ar ion-assisted Cl2 etching," Journal of Vacuum Science and Technology B, vol. 4, Jul. 1, 1986, p. 806.
Razek et al,, "Ultra-high vacuum direct bonding of a p-n junction GaAs wafer using low-energy hydrogen ion beam surface cleaning," Vacuum, Pergamon Press, vol. 81, No. 8, Mar. 23, 2007, pp. 974-978.
Razek et al., "Room-temperature ultrahigh vacuum bonding of Ge/GaAs p-n heterojunction wafer using 300 ev hydrogen ion beam surface cleaning," Journal of Science and Technology A, vol. 25, No. 5, Aug. 27, 2007, pp. 1480-1483.
Vallon et al., "Adhesion mechanisms of silica layers on plasma-treated polymers," Part I. Polycarbonate, Journal of Adhesion Science and Technology, 1996, vol. 10, No. 12, pp. 1287-1311.
Nelson et al., "Photoemission characterization of the $H_2$ plasma etched surface of InP," Journal of Applied Physics, vol. 70, No. 10, Nov. 15, 1991, pp. 5619-5622.
Robey et al., "Initial etching of GaAs (001) during $H_2$ plasma cleaning," Journal of Applied Physics, vol. 88, No. 5, Sep. 1, 2000, pp. 2994-2998.
Nelson et al., "Valency and type conversion in $CuInSe_2$ with $H_2$ plasma exposure: A photoemission investigation," Journal of Applied Physics, vol. 73, No. 12, Jun. 15, 1993, pp. 8561-8564.
Labanda et al., "Sputter cleaning and smoothening of GaAs(001) using glancing-angle ion bombardment," Applied Physics Letters, vol. 66, No. 23, Jun. 5, 1995, pp. 3114-3116.
Scheerschmidt et al., "UHV-Silicon Wafer Bonding at Room Temperature: Molecular Dynamics and Experiment," Proceedings of the Fourth International Symposium on Semiconductor Wafer, Sep. 1997, Paris, France, p. 381.
Otte et al., "A modified broad beam ion source for low-energy hydrogen implantation," Review of Scientific Instruments, vol. 69, No. 3, Mar. 1998, pp. 1499-1504.
Pearton et al., Edited by N. H. Nickel (Academic press, San Diego), vol. 61, 1999, p. 442.
Ide et al., "Role of $Ga_2O$ in the removal of GaAs surface oxides induced by atomic hydrogen," Journal of Vacuum Science and Technology A, vol. 12, No. 4, Jul./Aug. 1994, pp. 1858-1863.
Akatsu et al., "GaAs wafer bonding by atomic hydrogen surface cleaning," Journal of Applied Physics, vol. 86, No. 12, Dec. 15, 1999, pp. 7146-7150.
Harth et al., "Surface modification of polypropylene in oxygen and nitrogen plasmas," Surface and Coatings Technology, vol. 59, No. 1-3, 1993, pp. 350-355.
Petit et al., "Interaction of atomic hydrogen with native oxides on GaAs (100)," Journal of Vacuum Science & Technology A, vol. 10, No. 4, Jul./Aug. 1992, pp. 2172-2177.
Office Action issued in corresponding U.S. Appl. No. 15/122,943 dated Feb. 7, 2017.
Office Action issued in corresponding U.S. Appl. No. 15/122,943 dated Aug. 21, 2017.

* cited by examiner

METHOD AND DEVICE FOR THE SURFACE TREATMENT OF SUBSTRATES

RELATED APPLICATIONS

This application is a continuation of U.S. application Ser. No. 15/122,943, filed Sep. 1, 2016, which is a U.S. National Stage of International Application No. PCT/EP2014/056545, filed Apr. 1, 2014.

FIELD OF THE INVENTION

The present invention relates to a method for the surface treatment of a substrate surface of a substrate, as well as a corresponding device.

BACKGROUND OF THE INVENTION

In the semiconductor industry, different wet chemical etching methods and/or dry etching methods are used for surface treatment, especially surface cleaning and surface activation. Most notably, these assist in the removal of native surface oxides and/or carbon compounds. The significant difference between the wet chemical etching methods and the dry etching methods is the physical state of the cleaning agents used. In the case of a wet chemical etching method, liquids are used to clean the substrate surface; in a dry etching method, gases or plasmas are used to do so. Wet chemical etching methods are still justified in a few cases; in recent years, however, they have been replaced by dry etching systems in many other fields.

For dry etching, primarily plasma systems or ion sputtering systems are used.

A "plasma system" is understood as a system that can generate a quasi-neutral gas—a so-called plasma. By applying a voltage between the two electrodes, the process gas is ionized and forms an ionized, quasi-neutral gas—the so-called plasma. These systems are referred to as "capacitively coupled plasma" (CCP) plasma systems. Generating plasma by means of magnetic devices in so-called "inductively coupled plasma" (ICP) plasma systems is also conceivable. In this case, electromagnetic induction is used to manufacture a plasma. Furthermore, still other methods for generating plasma exist; these methods will not be elaborated upon here. The statements made hereinafter generally apply to all plasma systems, but will, however, be described with the help of CCP plasma systems, as the construction of such is relatively simple.

By means of its distinctive characteristics, this plasma acts on the surface of a substrate that is preferably located on or near one of the two electrodes. In general, either inert or reactive process gases can be used. In the case of a plasma system, the voltage between two electrodes, the gas composition, and the gas pressure are preset. Low-temperature plasmas thereby ignite above a critical pressure. This critical pressure is large in comparison to the pressures in a high vacuum chamber, but less than 1 bar. Low-temperature plasmas are mostly composed of oxygen, nitrogen, inert gases, or more complex organic gaseous compounds. These modify the substrate surface both physically, through ion bombardment, and chemically, through radicals generated in the plasma (source: S. Vallon, A. Hofrichter et. Al, Journal of Adhesion Science and Technology, (1996) vol. 10, no. 12, 1287). The physical modification is, above all, to be ascribed to the high speed and accompanying impact energies between gas- and plasma atoms and the atoms of the substrate surface.

Ion sputtering systems, on the other hand, have an ion source and an acceleration unit. In the ion source, a process gas is ionized and accelerated via the acceleration unit in the direction of the substrate surface. The accelerated ions form the so-called ion beam, which has a mean diameter, a corresponding divergence or convergence, and an energy density. The accelerated ions can loosen impurities from the substrate surface when the kinetic energy of the ions is greater than or at least as great as the bond energy between the impurity and the substrate surface. In this process, the kinetic energy of the ions can, however, also affect the substrate surface itself. This manipulation manifests itself in the alteration of the microstructure of the substrate surface, in the generation of point defects, incorporated ions in the crystal lattice, plastic deformation, etc.

The removal of impurities is called sputtering. For the sake of completeness, it should be noted that the separation process of atoms on surfaces could also be termed sputtering. Hereinafter, however, sputtering will only refer to the removal of atoms.

One technical problem is that, in the given environmental conditions, a reaction between the impurities (that are to be removed) on the substrate and the ions can occur without the impurities being removed from the substrate surface. Furthermore, the ions usually also react with the base material that is to be cleaned, and that is located underneath the impurities that are to be removed. This results in an inhomogeneous removal, and thus an increase in surface roughness.

Furthermore, adsorption of the gas and plasma atoms on the surface of the substrate often occurs.

According to the state of the art, the removal of impurities, especially by means of hydrogen, is done primarily using the following methods:

Plasma Processes:
1. The substrate surface is irradiated by means of a hydrogen plasma. The temperature of the surface is thereby usually very greatly increased by the plasma. In general, different plasma processes are used for different materials. For InP, for example, a so-called ECR (electron cyclotron resonance) plasma (source: A. J. Nelson, S. Frigo, D. Mancini, and R. Rosenberg, J. Appl. Phys. 70, 5619 (1991)) is used. The removal of all surface impurities from GaAs was, after hydrogen irradiation by means of an RF (radiofrequency) plasma, observed at a temperature of 380° C. after approximately 30 minutes (source: S. W. Robey and K. Sinniah, J. Appl. Phys. 88, 2994 (2000)). For CuInSe$_2$, the removal of surface oxides is described, for example, through the use of a hydrogen ECR plasma at a sample temperature of 200° C. (source: A. J. Nelson, S. P. Frigo, and R. Rosenberg, J. Appl. Phys. 73, 8561 (1993)).
2. Under the action of molecular hydrogen, the substrate surface is heated in a vacuum to more than 500° C. With GaAs, for example, a cleaning time of up to two hours is necessary (source: DE 100 48 374 A1).
3. The substrate surface is heated using atomic hydrogen in a vacuum. With GaAs, this takes place, for example, preferably in a temperature range between 350° C. and 400° C. This method is extensively detailed in the references (sources: Y. Ide and M. Yamada, J. Vac. Sci. Technol. A 12, 1858 (1994) or T. Akatsu, A. Plößl, H. Stenzel, and U. Gösele, J. Appl. Phys. 86, 7146 (1999) and DE 100 48 374 A1).

Ion Beam Processes:
The removal of surface impurities through the use of inert gases (Ar, N$_2$, xenon, . . . ) of an ion beam process is predominantly grounded upon the basis of a pure sputter removal (source: J. G. C. Labanda, S. A. Barnett, and L. Hultman "Sputter cleaning and smoothening of GaAs(001) using glancing-angle ion bombardment", Appl. Phys. Lett. 66, 3114 (1995)). The use of reactive gases ($H_2$, $O_2$, $N_2$, $CF_5$) is, on the other hand, predominantly based on a chemical reaction of the process gas with the surface impurities and the subsequent removal of the reaction products (desorption, stimulated partially thermally or by ion bombardment). Hydrogen has turned out to be a preferred process gas for the removal of various surface oxides and carbon impurities on the surface of semiconductors (source: DE 10 210 253 A1).

The named state-of-the-art methods of surface cleaning serve, in general, to prepare the substrate surface for a subsequent process. Subsequent processes are, for example, a coating with a photoresist, a deposition of one or more atoms or molecules by means of a vapor deposition process such as PVD (physical vapor deposition) or CVD (chemical vapor deposition).

Due to the ions, surface defects are generated above all in semiconductor materials, which defects can critically impair the electric function of components. Further, in the current state of the art, the fundamental problem arises that plasma systems and sputter systems always modify the substrate surface fundamentally, and usually damage it.

When plasma process or ion sputtering processes are used to clean or activate Si-, SiC-, Quartz-, or 3A-5B-semiconductor surfaces, for example, additional damage occurs as a substantial disadvantage on the surface of the semiconductor (e.g. roughness, formation of metallic phases, oxide layer growth, formation of a thin water film). Admittedly, verifiable, efficient surface cleaning of most impurities does take place using the plasma systems; however, it becomes apparent, especially with organic components, that this cleaning method is not sufficient to completely remove the organic connections.

The primary reason for the generation of damage when using plasma systems is essentially the direct contact between the plasma and the semiconductor surface and the resulting interaction between plasma components (for example, ions, radical and highly excited molecules/atoms, electrons, and UV photons) and the atoms on the substrate surface. In particular, the highly excited and therefore highly energetic particles or the ions of a plasma or the particles or ions of an ion sputtering system generate, with high probability, disadvantageous damage processes of the substrate surface, especially a highly sensitive semiconductor surface.

The low-temperature plasmas, generated using oxygen, nitrogen, inert gases, or more complex organic gaseous compounds, modify the substrate surface through ion bombardment as well as through surface reactions using radicals that exist in the plasma (source: K. Harth, Hibst, H., Surface and Coatings technology (1993) vol. 59, no. 1-3, 350). Additionally, gas atoms on the surface are absorbed (source: K. Scheerschmidt, D. Conrad, A. Belov, H. Stenzel, "UHV-Silicon Wafer Bonding at Room temperature: Molecular Dynamics and Experiment", in Proc. 4. Int. Symp. on Semiconductor Wafer Bonding, September 1997, Paris, France, p. 381).

The crucial disadvantage of the methods for cleaning semiconductor surfaces under the influence of atomic or molecular hydrogen in a vacuum is the high temperatures that are necessary and that usually lie between 400° C. and 500° C. (see: DE 100 48 374 A1). The high process temperatures are necessary to enable both an effective reaction between the hydrogen and the impurities and the desorption of parts of the resulting reaction products.

A further disadvantage of the described state-of-the-art methods for cleaning semiconductor surfaces using molecular and/or atomic hydrogen is the long process times; in the case of molecular hydrogen, these amount to at least two hours (see: DE 100 48 374 A1).

The use of the embodiment according to the invention from the patent specification DE 102 10 253 A1 is not efficient enough, as removing the impurities through a purely chemical process by means of hydrogen ions of Si, $SiO_2$, SiC quartz, and Zerodur does not lead to complete removal.

SUMMARY OF THE INVENTION

The object of the present invention is therefore to create a new method that permits the removal of chemical impurities or disruptive substrate surface layers (e.g. oxides, including natural oxides, carbon, and carbon compounds) on the surfaces of substrates, especially semiconductors, without generating additional damage (e.g. increase of surface roughness, stoichiometry change, and crystal lattice damage) on the substrate surface, or inside with the least possible damage to the substrate surface.

This object is accomplished with the characteristics of the independent claims. Further advantageous embodiments of the invention are given in the dependent claims. All combinations of at least two of the characteristics given in the specification, the claims, and/or the figures also fall within the scope of the invention. With given value ranges, values lying within the given limits should also be considered boundary values and should be claimable in any combination.

The basic idea of the present invention is to clear the substrate surface of a substrate from impurities before further treatment in a process chamber with a directed ion beam, whereby the ion beam has a first, especially gaseous, component and a second, especially gaseous, component, or a working gas is fed into the process chamber. The second component serves to bind the detached impurities. Preferably, the second component is directed through the process chamber with a flow velocity, in order to carry the impurities out of the process chamber.

According to the invention, particularly gas mixtures or pure gases, especially pure inert gases, are subsumed under "first component" or "second component".

In other words, the invention relates to a method and a system for removing surface impurities from different materials, especially semiconductor materials, at room temperature ($R_T$) or at very low temperatures using particularly low-energy ion sputtering and/or forming gas. The temperature thereby is less than 500° C., preferably less than 300° C., more preferably less than 100° C., and most preferably room temperature.

The forming gas preferably has a hydrogen content of greater than 20 percent. "Forming gas" is understood to preferably mean gas mixtures comprising argon (Ar) and hydrogen ($H_2$) or gas ion mixtures comprising nitrogen ($N_2$) and hydrogen ($H_2$). It is, however, conceivable for the forming gas to be composed of only a single gas component, especially only argon or only hydrogen.

The invention therefore relates especially to a method and a system that clears a substrate surface from contaminations at the lowest possible temperatures, preferably at room temperature, without damaging the substrate surface. The method is preferably applicable for economically cleaning semiconductors and semiconductor structures. Preferably, the system and method according to the invention are used in order to prepare substrate surfaces for a subsequent bond, especially a permanent bond.

The preferred embodiment uses broad-band ion beams for surface-cleaning the substrate surface.

In one advantageous embodiment, the surface cleaning is not done completely, but selectively. This embodiment is used particularly in the fields of optics, optoelectronics, and sensors to clean exclusively defined/predetermined areas of the substrate surface. The selective surface cleaning thereby takes place either through a narrow-band ion beam generated directly through focusing or through a narrow-band ion beam generated from a broad-band ion beam generated from a broad-band ion beam by means of an aperture. A further possibility according to the invention would be masking the substrate with a correspondingly exposed and chemically treated photoresist. The photoresist then serves as a positive or negative mask. A further possibility according to the invention would be the use of a mechanical shadow mask.

One concept according to the invention is especially to accelerate the ions of the first component through an ion source, especially through a broad-beam ion source, onto the substrate surface. Additionally, the process chamber is flushed with a forming gas, or more preferably with pure hydrogen, as the second component. Heating (preferably as small as possible) of the substrate, especially via contact with the sample holder, is also conceivable. When using broad-beam ion sources, the chemical contaminations (native oxides, carbon, impurities) on the substrate can be removed without harmful effects on the surfaces of substrates by using low-energy ions (<1000 eV). A further advantage of the use of a broad-beam ion source includes cleaning a very large section of the substrate surface (in an extreme case, the entire substrate surface).

In particular, the use of a low-energy ion sputtering system underlies the invention; this system shoots ions onto a substrate surface. The ions are preferably shot onto the substrate surface in a broad-band ion beam. A "broad-band ion beam" is understood to mean an ion beam whose mean diameter lies in the range of the diameter of the substrate. The ratio between the ion beam diameter and the diameter of the substrate is thereby especially greater than 1/100, preferably greater than 1/10, more preferably greater than ½, and most preferably equal to 1. The broad-band ion beam preferably covers the entire substrate surface.

Insofar as the diameter of the ion beam on the substrate surface is smaller than the diameter of the substrate surface, especially a relative movement between the ion beam and the substrate surface will take place according to the invention in order to reach all positions on the substrate surface that are to be cleaned. Preferably, the relative movement is accomplished by moving the substrate sample holder relative to the ion source. In this embodiment, a position-specific (i.e., spatially-resolved) cleaning of substrate surfaces is made possible. In particular, the use of a narrow-band ion beam is conceivable here, whereby the ratio between the diameter of the ion beam and the diameter of the substrate surface is adjusted to be smaller than 1, preferably smaller than 1/10, more preferably smaller than 1/100, and most preferably smaller than 1/1000. The smaller the ratio, the larger the resolution of a cleaning process, but the longer it takes to clean a corresponding area through relative movement on the substrate to be cleaned. The narrow-band ion beam can be either directly focused using optical elements or generated from a broad-band ion beam using masks and aperture techniques. The optical elements especially comprise electric and/or magnetic lenses and are summarized by the term "optics". When using masks and aperture techniques, an automated unit, especially a robot, can preferably be used to quickly change masks or diaphragms with different apertures. It is also conceivable to generate a narrow-band ion beam using a source that has a correspondingly small cross section.

One aspect according to the invention, regardless of the ion beam diameter used, includes in the use of a low-energy ion sputtering system in connection with a corresponding forming gas, especially a pure argon or pure hydrogen gas (second component). The forming gas is thereby used as a process gas to generate ions in the ion source of the ion sputtering system and/or as purge gas in the process chamber. The combination according to the invention of a low-energy ion sputtering system and a corresponding forming gas ensures that the substrate surface is cleared of impurities, but not modified or even damaged. One aspect according to the invention therefore is the fact that low-energy ions are indeed accelerated by the ion sputtering system onto the substrate surface, but the energy of the ions is not sufficient to cause any noteworthy modification or damage to the substrate. The damage is at most very minor and is indicated by a depth range, within which a change of the microstructure of the substrate is still verifiable. This depth range is, owing to the use of the method and system according to the invention, especially less than 10 μm, preferably less than 1 μm, more preferably less than 100 nm, most preferably less than 15 nm, even more preferably less than 7 nm, even more preferably less than 3 nm, more preferably less than 1.5 nm, and most preferably equal to zero. In the ideal case, therefore, absolutely no damage occurs from the ion bombardment.

The first component (especially forming gas), specifically adjusted to the impurities and/or substrate surface, reacts with the sputtered atoms/molecules of the impurities and, according to the invention, thereby prevents them from re-depositing back onto the substrate surface. The compounds so formed (and bound by the first component) are preferably sucked away by a vacuum system or bound by snares in the process chamber, so that they are prevented from once again depositing on the substrate surface. Through an additional flushing of the process chamber with the second component (especially a forming gas, preferably the same forming gas that is ionized in the ion source), the process according to the invention can be optimized and expedited. With particular advantage, a broad-band ion beam can be used in order to perform a complete cleansing.

The embodiment and system according to the invention constitute an efficient, economical means of removing surface impurities, especially carbon-containing impurities. The embodiment according to the invention can essentially be used on all types of substrate surfaces, but is particularly efficient when used on substrate surfaces with very low roughness. The roughness is specified as mean roughness, square roughness, or averaged roughness. In general, the values ascertained for the mean roughness, the square roughness, and the averaged roughness differ from one another for the same measurement section or measured surface, but lie in the same range. The following value ranges for roughness are therefore to be understood as values for the mean roughness, the square roughness, or the averaged roughness. According to the invention, the roughness is especially less than 100 μm, preferably less than 10 μm, more preferably less than 1 μm, most preferably less than 100 nm, and most preferably of all less than 10 nm. The embodiment according to the invention is especially also suitable for cleaning substrates on which optical elements are manufactured.

Furthermore, it is also possible to clean substrates with functional elements that have a relatively complicated topography—for example diffraction gratings, Fresnel lenses, MEMs devices, and cavities for holding LEDs.

At the same time, the choice of a sufficiently low kinetic ion energy prevents the creation of damage in the semiconductor material.

In a first embodiment according to the invention, the system according to the invention comprises at least one high vacuum chamber with an additionally associated broad-beam ion source of the Kaufman-type or RF broad-ion source (source: K. Otte. A. Schindler, F. Bigl, and H. Schlemm, Rev. Sci. Instrum., 69, 1499 (1998)). The diameter of the broad-band ion source is between 10 mm and 1000 mm, preferably between 20 mm and 800 mm, more preferably between 30 mm and 600 mm, and most preferably between 40 mm and 400 mm.

The ion system according to the invention can, according to one embodiment, be completely evacuated. An evacuation of this type of the process chamber takes place especially before the introduction of the working gas or the second component. The ion system can be evacuated to a pressure of less than 1 bar, preferably less than $10^{-3}$ mbar, more preferably less than $10^{-5}$ mbar, most preferably less than $10^{-7}$ mbar, and most preferably of all less than $10^{-8}$ mbar. After the evacuation, the ion system is flushed with the working gas. This flushing takes place until a working pressure is reached.

The working pressure in the ion chamber lies thereby especially between $10^{-8}$ mbar and 1 bar, preferably between $10^{-6}$ mbar and 1 bar, more preferably between $10^{-6}$ mbar and 1 mbar, and most preferably between $10^{-5}$ mbar and 1 mbar.

The working pressure of the second component or the working gas lies especially between $1\times10^{-3}$ mbar and $8\times10^{-4}$ mbar. A controlled gas stream of gas mixture (argon with hydrogen), (nitrogen with hydrogen) or pure hydrogen from 1 to 100 sccm/min ("standard cm$^3$/min."="cm$^3$/min. under standard conditions") is introduced to the broad-beam ion source that is used to clean the substrate surface. In particular embodiments, hydrogen, especially pure, is used.

In a first, particularly preferred embodiment, the substrate sample holder is mounted and fixed on a table that has at least one rotational degree of freedom, preferably at least two rotational degrees of freedom, most preferably at least three rotational degrees of freedom, arranged normally to each other.

In a second preferred embodiment, the substrate sample holder is mounted and fixed on a table that has multiple translational and rotational degrees of freedom. The table can move at least along an X and a perpendicular Y direction. Preferably, the table also has a degree of freedom in a Z direction that runs perpendicular to the X and Y directions. In an especially preferred embodiment, the table has even more, especially exactly three, degrees of freedom of rotation. It is thereby possible to move and to align the substrate sample holder inside of the process chamber in all directions. The angle of incidence of the ions is defined as the angle between the ion beam (more precisely, the center axis or the axis of symmetry of the ion beam) and the normal onto substrate surface. The angle of incidence of the ions is freely adjustable between 0° (perpendicular incidence) and 90° (parallel incidence to the substrate surface). The angle of incidence of the ions is especially less than 90°, preferably less than 70°, more preferably less than 50°, most preferably less than 30°, and most preferably above all equal to 0°. As the ion source is preferably statically fixed in relation to the process chamber, the angle of incidence of the ions is adjusted by rotating the substrate, especially by tilting the substrate sample holder. According to the invention, a movable ion source is conceivable, if not preferred; in this case, the corresponding angle of incidence of the ions would be adjusted by moving the ion source.

Owing to the use of special broad-band ion sources and the fact that, with ion sources of this type, it is possible to irradiate the entire surface of a substrate with ions relatively simultaneously, a static substrate sample holder and/or table is also a possibility in particular embodiments.

The distance between the substrate sample holder and an exit opening of the ion source is especially less than 100 cm, preferably less than 80 cm, more preferably less than 60 cm, and most preferably less than 40 cm. In very special embodiments, the energy of the ions on the substrate surface can be adjusted by means of the distance of the substrate to the exit opening on the ion source in connection with a correctly adjusted forming gas density. For this purpose, measuring equipment is provided to measure the distance.

The substrate sample holder can be heated to a temperature between 0° C. and 500° C. during the cleaning process by at least one heating element, especially multiple heating elements. The substrate temperature, especially in connection with temperature sensors, is set between 0° C. and 500° C., preferably between 0° C. and 400° C., more preferably between 0° C. and 300° C., most preferably between 0° C. and 200° C., and most preferably of all between 0° C. and 250° C.

The substrate sample holder is preferably controllable via a computer and/or a microcontroller and/or firmware and/or corresponding software.

Particularly preferably, starting positions can be programmed so that the substrate sample holder can fully automatically scan a given predetermined area of the substrate surface. By so doing, optimal scanning techniques can be saved and recalled at the push of a button. This option is useful above all when using narrow-band ion sources, in order to be able to reach all positions of the substrate surface that are to be cleaned. When using broad-band ion sources, an especially linear and/or rotary shift of the substrate sample holder during the ion irradiation can help to homogenize the effect according to the invention. Above all, high-frequency linear and rotary movements are advantageous in this case. The frequency of the substrate sample holder, hence the quantity of oscillations that the substrate sample holder conducts per second in an arbitrary direction, is thereby especially greater than $\frac{1}{100}$, preferably greater than $\frac{1}{10}$, more preferably greater than 1, most preferably greater than 10, and most preferably of all greater than 100. The number of revolutions per minute (rounds-per-minute rpm) of the substrate holder is greater than $\frac{1}{10}$, more preferably greater than 1, most preferably greater than 10, and most preferably of all greater than 100.

With respect to the ion source, the inner structure of the ion source that is preferably used according to the invention roughly corresponds to the Kaufman type. One difference exists especially in the extraction grid system. The ions extracted from the plasma chamber are separated in the additional grid system by applying an HF alternating field (20 MHz). The total transmittance thereby is roughly <20%. That corresponds to an ion current density of 1-100 μA/cm$^2$. For certain uses, for which greater current densities can be used without mass separation, the so-called IS mode (ion source mode) can be used.

In RAH mode, the ion source permits, in addition to the prevention of impurities in the ion beam, a targeted selection of specific ion types with certain states of charge. Their disadvantages are a smaller ion energy eV and a lower ion current density ($E_{ion}$<800 eV and $j_{ion}$<500 µA/cm² in the non-mass-separating IS mode or $E_{ion}$<500 eV and $j_{ion}$<50 µA/cm² in the mass-separating RAH mode). For a more exact description of the functionality of the ion source, consult the corresponding literature (source: K. Otte. A. Schindler, F. Bigl, and H. Schlemm, Rev. Sci. Instrum., 69, 1499 (1998)).

According to the invention, ion current densities for the ion current, according to one embodiment, are revealed immediately following the exit from the source of between $10^{-5}$ µA/cm² and $10^5$ µA/cm², preferably between $10^{-3}$ µA/cm² and $10^3$ µA/cm², and more preferably between 1 µA/cm² and 500 µA/cm². The corresponding ion current density on the substrate surface is preferably equal to the ion current density of the density. In general, however, a deliberate and/or accidental attenuation takes place, especially due to the divergence of the ion current. The ion current densities of the ion current at the substrate surface lie between $10^{-5}$ µA/cm² and $10^5$ µA/cm², preferably between $10^{-3}$ µA/cm² and $10^3$ µA/cm², and more preferably between 1 µA/cm² and 500 µA/cm².

With respect to the working gas (first and/or second components, especially the following atom- or molecule types are used as a working gas:

Forming gas FG (argon+hydrogen) and/or
Forming gas RRG (hydrogen+argon) and/or
Forming gas NFG (argon+nitrogen) and/or
Hydrogen, especially pure, and/or
Argon, especially pure.

between 50 V and 800 V. The ion beam current density on the substrate lies especially in the range between 0.001 and 5000 µA/cm², preferably between 0.01 and 2500 µA/cm², more preferably between 0.1 and 1000 µA/cm², and most preferably between 1 and 500 µA/cm². Preferably, an angle of incidence of the ions is used that is less than 50°, preferably less than 40°, more preferably less than 30°, and most preferably less than 22°. The exposure time and the heating of the substrate surface depend especially on the type of semiconductor material used and the thickness of the contamination layer on the surfaces. The distance from the substrate to the ion source is set especially between 1 and 100 cm, preferably between 10 and 80 cm, more preferably between 20 and 50 cm, and most preferably at about 30 cm (measured from the exit opening of the ion source). The heating of the substrate surface to a certain temperature also depends on the type of semiconductor material used. The passivating effect of the hydrogen is generally and in the simplest case described by the following chemical reactions (source: A. J. Pearton and J. W. Lee, vol. 61, Edited by N. H. Nickel (Academic press, San Diego) p. 442 (1999)):

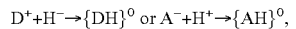

where $D^+$ represents an ionized donor and $A^-$ represents an ionized acceptor.

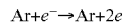

In one special embodiment according to the invention, multiple ion sources can be attached to the process chamber, especially a high-vacuum ion chamber, especially more than 1, preferably more than 2, and more preferably more than 3.

TABLE 1

The table shows a listing of three exemplary gas mixtures, FGx, RFGx, and NFGx, with their respective proportions of argon and hydrogen or argon and nitrogen.

| Gas Mixture FG | Ar (%) | H (%) | Gas Mixture RFG | H (%) | Ar (%) | Gas Mixture NFG | Ar (%) | N2 (%) |
|---|---|---|---|---|---|---|---|---|
| FG 0 | 100 | Atmosphere (10 sccm) | RFG 0 | 100 | Atmosphere (10 sccm) | NFG 0 | 100 | Atmosphere (10 sccm) |
| FG 1 | 96 | 4 | RFG 1 | 100 | 0 | NFG 1 | 95 | 5 |
| FG 2 | 90 | 10 | RFG 2 | 95 | 5 | NFG 2 | 90 | 10 |
| FG 3 | 80 | 20 | RFG 3 | 90 | 10 | NFG 3 | 80 | 20 |
| FG 4 | 70 | 30 | RFG 4 | 70 | 30 | NFG 4 | 70 | 30 |
| FG 5 | 50 | 50 | RFG 5 | 50 | 50 | NFG 5 | 50 | 50 |

In regards to the system according to the invention, in this section, the method for cleaning the substrate surface by means of the forming gases RFGx (hydrogen content 100% to 50%, with Ar from 0% to 50%) is described. The system according to the invention comprises an ion beam source and a substrate sample holder with an optional heating element. The substrate is fixed on the substrate sample holder. To operate the ion source, a controlled amount of forming gas is introduced.

The gas flow is set especially between 0.001 and 100,000 sccm/min, preferably between 0.01 and 10,000 sccm/min, more preferably between 0.1 and 1000 sccm/min, and most preferably between 1 and 100 sccm/min. The pressure in the process chamber depends on the type of the gas used as well as the pump system used; regardless, it is set between $10^{-8}$ mbar and 1 bar, preferably between $10^{-7}$ mbar and $10^{-2}$ mbar, and more preferably between $10^{-6}$ mbar and $10^{-3}$ mbar. The potential difference between the ion source and the substrate surface is especially set between 1 V and 5000 V, preferably between 30 V and 2500 V, and most preferably By using multiple ion sources, the ion density on the surface of the substrate can, on one hand, be raised and better controlled. Further, multiple ion sources allow for the use of several different ion types that exist separate from each other during production and meet only after leaving the ion source, especially only at or shortly before the substrate surface. The method according to the invention can be used to clean all types of substrate surfaces. Particularly preferably, however, the method is suited for cleaning substrate surfaces made of the following materials/material combinations:

Silicon, thermally oxidized silicon, quartz, Zerodur, silicon carbide, molybdenum, and/or 3A-5B semiconductor materials; and For special uses:

Homogenous semiconductor structures during direct wafer bonding; and/or
GaAs/GaAs, InP/InP, Ge/Ge, Si/Si, Si, and $SiO_2$; and/or
Heterogeneous semiconductor structures during direct wafer bonding; and/or GaAs/InP, GaAs/Ge, GaAs/Si, Ge/Si, Ge/InP, and InP/Si; and/or Metals; and/or Cu, Al, W, Mo, Ag, Au, Pt, Zn, Ni, and Co; and/or Alloys; and/or A combination of arbitrary, especially aforementioned, materials.

After the substrate surfaces have been cleaned according to the invention, they can be delivered to a further process step. Lithography processes like imprint processes or photolithography, coating processes, etching processes, wet-chemical cleaning processes and/or vacuum deposition processes are conceivable. The vacuum deposition processes preferred according to the invention especially include:

Physical Vapor Deposition (PVD);

Chemical Vapor Deposition (CVD);

Molecular Beam Epitaxy (MPE);

Plasma-Enhanced Chemical Vapor Deposition (PECVD);

Plasma-Enhanced Physical Vapor Deposition (PEPVD); and

Atomic Layer Deposition (ALD).

With special preference, the method according to the invention is suitable for cleaning the substrate surface in preparation for a subsequent bonding process with a second substrate surface of a second substrate. Above all, in a permanent bonding process like a metal bonding process or a fusion bonding process, the two substrate surfaces will both preferably have an extremely high purity and flatness in order to enable a good connection of both substrate surfaces. Any kind of impurities inhibits the bonding process decisively. The second substrate surface will be/is preferably cleaned using the same method. With special preference, this is a direct bond. When two metal surfaces that have been treated according to the invention are bonded, a permanent bond is the result, preferably automatically. With substrate surfaces like, for example, silicon or silicon oxide, a so-called pre-bond can also take place first, which pre-bond is converted into a permanent bond by a subsequent heat-treatment process. The generation of the pre-bond preferably takes place at room temperature. In an especially preferential embodiment, the substrate surfaces are so pure that the temperature necessary to produce the permanent bond can be reduced to a minimum. In the most ideal case, the generation of the permanent bond for all types of substrate surfaces takes place immediately and without a pre-bond step, especially without an additional heat-treatment step.

A "direct bond" is understood to mean the joining of two substrate surfaces through covalent (atomic) bonds alone. In a first step, the formation of a so-called pre-bond takes place that is characterized by a still-reversible, i.e., undoable, connection between both substrate surfaces, induced by van der Waals forces. If the two substrate surfaces are first connected to each other via a pre-bond, at least it is no longer possible for them to be contaminated further or again. The pre-bond can subsequently be converted through heat-treatment into a permanent, i.e., irreversible, non-undoable direct bond. The direct bond is characterized especially by the formation of covalent bonds between substrate surfaces. These covalent bonds are especially covalent Si—Si or Si—O bonds. As a result, the described embodiment and system according to the invention are used, above all, for a process in which at least two substrates must be bonded with each other. With special preference, the system according to the invention is therefore a part of a vacuum cluster, more preferably a high-vacuum cluster, and most preferably an ultra-high-vacuum cluster, and is above all used in the same in combination with an aligning system and/or a bonder in order to clean substrates in a corresponding process and prepare them for a bond. The pressure in one of the vacuum clusters mentioned is especially less than 1 bar, preferably less than $10^{-1}$ mbar, more preferably less than $10^{-3}$ mbar, most preferably less than $10^{-5}$ mbar, and most preferably of all less than $10^{-8}$ mbar.

The method according to the invention can also serve to clean the surfaces of substrates that are bound together by a metallic bond, especially a diffusion bond, a eutectic bond, an anodic bond, or another arbitrary bond. In particular, the method according to the invention can therefore also be used to clean metal and/or ceramic surfaces.

The system according to the invention is especially preferably used to clean the surfaces of substrates that are aligned towards each other inside of the same vacuum cluster by an aligner and bonded together by a bonder. These aligners can, for example, be aligners like in AT 405 775 B, PCT/EP 2013/062473, or PCT/EP 2013/075831, insofar as reference is made to these. With particular preference, the substrates are fixed in between the aligner and the bonder by means of magnetic elements. One such fixing device is extensively mentioned in the patent claim PCT/EP 2013/056620, insofar as reference is made to this.

Various optimal parameter sets are specified in the following discussion, which parameter sets have, in the cases of the substrate surfaces mentioned, led to a complete removal of the impurities, especially of carbon-containing impurities and native oxides.

With respect to GaAs substrate surfaces, the process according to the invention is primarily, but not exclusively, used for oxide removal.

The working gases used for GaAs surfaces are the forming gas mixtures RFG1 (100% hydrogen) or RFG 2 (see Table 1). The ion energy thereby lies between 100 eV and 500 eV, preferably between 200 eV and 400 eV, and most preferably at exactly 300 eV. The current density lies between 2.5 µA/cm² and 6.5 µA/cm², preferably between 3.5 µA/cm² and 5.5 µA/cm², and most preferably at exactly 4.5 µA/cm². The temperature of the substrate surface lies between 100° C. and 200° C., preferably between 125° C. and 175° C., and most preferably at exactly 150° C. The duration of treatment of the substrate surface amounts to more than 10 s, preferably more than 50 s, more preferably more than 100 s, and most preferably more than 300 s. The ion dose of the ions lies between $10^{12}$ ions/cm²s and $10^{16}$ ions/cm²s, preferably between $10^{13}$ ions/cm²s and $10^{15}$ ions/cm²s, and most preferably at exactly $1.5 \times 10^{14}$ ions/cm²s.

The mechanism of the oxide removal of the GaAs surfaces through H-ion bombardment is probably based on the chemical reaction of the hydrogen ions or of radical hydrogen with the arsenic oxide. The resulting arsenic oxide vaporizes under vacuum. The corresponding chemical reaction is:

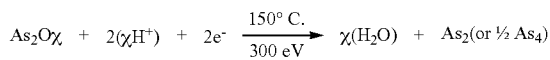

Here, χ is 3 or 5, corresponding to the different oxides of the arsenic on the GaAs surface. The electrons come from a neutralizer or conduction band of the "potential-free probe" (source: E. Petit, F. Houzay, and J. Moison, J. Vac. Sci. Technol. A 10, 2172 (1992)).

A corresponding process is expected when cleaning gallium oxide.

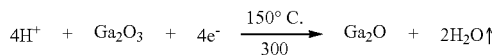

$$4H^+ + Ga_2O_3 + 4e^- \xrightarrow[300]{150°\,C.} Ga_2O + 2H_2O\uparrow$$

The sublimation of $Ga_2O$ is also the deciding step for the removal of the Ga-oxide from the substrate surface. It is also conceivable that, at low temperature, especially at temperatures below 200° C., no sublimation of $Ga_2O$ takes place; rather, a reduction of the gallium arsenide via atomic hydrogen takes place. Gallium and water are formed as a result; the water evaporates accordingly.

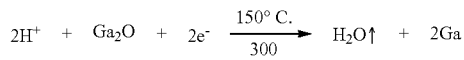

$$2H^+ + Ga_2O + 2e^- \xrightarrow[300]{150°\,C.} H_2O\uparrow + 2Ga$$

With respect to Ge substrate surfaces, the process according to the invention is primarily used for oxide removal and for cleaning organic compounds.

The working gases used for Ge surfaces are the forming gas mixtures RFG1, RFG3, RFG4, and RFG5 (see Table 1). The ion energy lies especially between 100 eV and 800 eV, preferably between 150 eV and 400 eV, and most preferably at exactly 350 eV, 200 eV, 400 eV (see Table 2). The current density lies between 4.5 µA/cm² and 8.5 µA/cm², preferably between 5.5 µA/cm² and 7.5 µA/cm², and most preferably at exactly 6.5 µA/cm². The temperature of the substrate surfaces lies preferentially between 275° C. and 350° C., preferably between 300° C. and 325° C., and most preferably at exactly 300° C. The duration of treatment of the substrate surface amounts to more than 10 s, preferably more than 300 s, more preferably more than 600 s, and most preferably more than 1200 s. The ion dose of the plasma lies especially between $10^{12}$ ions/cm²s and $10^{16}$ ions/cm²s, more preferably between $10^{13}$ ions/cm²s and $10^{15}$ ions/cm²s, and most preferably at exactly $5\times10^{14}$ ions/cm²s.

TABLE 2

Preferred process parameters for cleaning a germanium substrate surface for the different gas mixtures.

| Working Gas | Ion Energy | Current Density | Substrate Temperature | Bombardment Time |
|---|---|---|---|---|
| RFG1 | 350 eV | 4.5 µA/cm² | 350° C. | 25 min |
| RFG2 | 300 eV | 4.5 µA/cm² | 200° C. | 8 min |
| RFG3 | 300 eV | 4.5 µA/cm² | 150° C. | 4-5 min |
| RFG5 | 500 eV | 500 µA/cm² | RT ° C. | 5 min |

The complete removal of the native oxide and the carbon from the Ge surface down to a relatively small amount (<1%), which can also be caused by impurities in the process chamber, was done according to the process parameters of Table 2 through ion bombardment. If the surface temperature is raised from room temperature to ca. 350° C., the carbon and the oxide layers can be completely removed from the germanium substrate surface. The possible chemical reaction for the removal of the germanium oxide via the hydrogen ion beam can be described as follows:

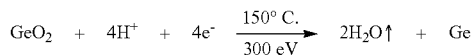

$$GeO_2 + 4H^+ + 4e^- \xrightarrow[300\,eV]{150°\,C.} 2H_2O\uparrow + Ge$$

With respect to InP substrate surfaces, the process according to the invention is, primarily but not exclusively, used for oxide removal.

The working gases used for InP surfaces are the forming gas mixtures RFG1, RFG3, and NFG5 (50% nitrogen+50% argon). The ion energy lies between 100 eV and 500 eV, preferably between 200 eV and 400 eV, and most preferably at exactly 300 eV. The current density lies between 2.5 µA/cm² and 6.5 µA/cm², preferably between 3.5 µA/cm² and 5.5 µA/cm², and most preferably at exactly 4.5 µA/cm². The temperature of the substrate surface lies between 125° C. and 225° C., preferably between 150° C. and 200° C., and most preferably at exactly 175° C. The duration of treatment of the substrate surface amounts to more than 10 s, preferably more than 100 s, more preferably more than 300 s, and most preferably more than 600 s. The ion dose of the plasma lies between $10^{12}$ ions/cm²s and $10^{16}$ ions/cm²s, more preferably between $10^{13}$ ions/cm²s and $10^{15}$ ions/cm²s, and most preferably at exactly $1.5\times10^{14}$ ions/cm²s.

TABLE 3

Preferred process parameters for cleaning an InP substrate surface for the different gas mixtures.

| Working Gas | Ion Energy | Current Density | Substrate Temperature | Bombardment Time |
|---|---|---|---|---|
| RFG1 | 300 eV | 4.5 µA/cm² | 175° C. | 10 min |
| RFG3 | 200 eV | 4.5 µA/cm² | 200° C. | 5 min |
| NFG5 | 200 eV | 4.5 µA/cm² | 150° C. | 2 min |

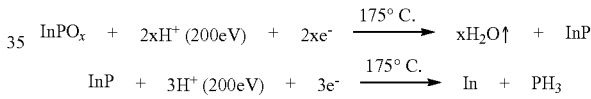

$$InPO_x + 2xH^+(200eV) + 2xe^- \xrightarrow{175°\,C.} xH_2O\uparrow + InP$$

$$InP + 3H^+(200eV) + 3e^- \xrightarrow{175°\,C.} In + PH_3$$

With respect to Si substrate surfaces, the working gases used are the forming gas mixtures FG0, FG1, FG3, RFG5, and NFG3 (see Table 1). The ion energy lies between 150 eV and 800 eV, preferably between 150 eV and 500 eV, and most preferably at exactly 500 eV. The current density lies between 20 µA/cm² and 70 µA/cm², preferably between 30 µA/cm² and 60 µA/cm², and most preferably between 40 µA/cm² and 50 µA/cm². The temperature of the substrate surface lies between 300° C. and 400° C., preferably between 325° C. and 375° C., and most preferably at exactly 350° C. The duration of treatment of the substrate surface amounts to more than 10 s, preferably more than 50 s, more preferably more than 100 s, and most preferably more than 300 s. The ion dose of the plasma lies between $10^{13}$ ions/cm²s and $10^{17}$ ions/cm²s, more preferably between $10^{14}$ ions/cm²s and $10^{16}$ ions/cm²s, and most preferably at exactly $1.5\times10^{15}$ ions/cm²s.

TABLE 4

Preferred process parameters for cleaning a silicon substrate surface for the different gas mixtures.

| Working Gas | Ion Energy | Current Density | Substrate Temperature | Bombardment Time |
|---|---|---|---|---|
| FG0 | 300 eV | 5 mA/cm² | 300° C. | 1 min |
| FG1 | 300 eV | 500 µA/cm² | 300° C. | 3 min |
| FG3 | 200 eV | 5 mA/cm² | 150° C. | 0.5-1 min |
| RFG1 | 300 eV | 35 µA/cm² | 350° C. | 5 min |

TABLE 4-continued

Preferred process parameters for cleaning a silicon substrate surface for the different gas mixtures.

| Working Gas | Ion Energy | Current Density | Substrate Temperature | Bombardment Time |
|---|---|---|---|---|
| RFG5 | 500 eV | 500 µA/cm² | RT | 4 min |
| NFG2 | 500 eV | 5 mA/cm² | RT | ? |

The removal of the silicon oxide is preferably described by the following reaction equation:

$$SiO_2 + 4H^+(500eV) + Ar^+ + 5e^- \xrightarrow{25°C.} SiAr + 2H_2O\uparrow$$

With respect to silicon dioxide substrate surfaces, the working gases used are the forming gas mixtures FG0, FG2, and FG5 (see Table 1). The ion energy lies between 150 eV and 800 eV, preferably between 475 eV and 525 eV, and most preferably at exactly 500 eV. The current density lies between 20 µA/cm² and 70 µA/cm², preferably between 30 µA/cm² and 60 µA/cm², and most preferably between 40 µA/cm² and 50 µA/cm². The temperature of the substrate surface lies between 300° C. and 400° C., preferably between 325° C. and 375° C., and most preferably at exactly 350° C. The duration of treatment of the substrate surface amounts to more than 10 s, preferably more than 50 s, more preferably more than 100 s, and most preferably more than 300 s. The ion dose of the plasma lies between $10^{13}$ ions/cm²s and $10^{17}$ ions/cm²s, more preferably between $10^{14}$ ions/cm²s and $10^{16}$ ions/cm²s, and most preferably at exactly $1.5 \times 10^{15}$ ions/cm²s.

TABLE 5

Preferred process parameters for cleaning a silicon oxide substrate surface for the different gas mixtures.

| Working Gas | Ion Energy | Current Density | Substrate Temperature | Bombardment Time |
|---|---|---|---|---|
| FG0 | 500 eV | 5 mA/cm² | 300° C. | 1 min |
| FG2 | 500 eV | 400 µA/cm² | 150° C. | 50 sec |
| FG5 | 500 eV | 500 µA/cm² | RT | 4 min |

The removal of the silicon oxide is preferably described by the following reaction equation:

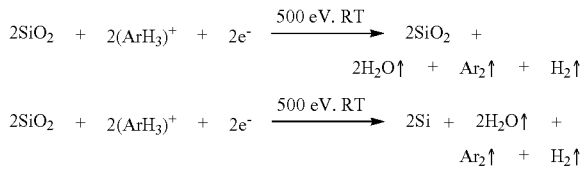

$$2SiO_2 + 2(ArH_3)^+ + 2e^- \xrightarrow{500 eV, RT} 2SiO_2 + 2H_2O\uparrow + Ar_2\uparrow + H_2\uparrow$$

$$2SiO_2 + 2(ArH_3)^+ + 2e^- \xrightarrow{500 eV, RT} 2Si + 2H_2O\uparrow + Ar_2\uparrow + H_2\uparrow$$

With respect to Zerodur (AlSiO₂) surfaces, the working gas used is the forming gas mixture FG5 (50% argon and 50% hydrogen) (see Table 1). The ion energy lies between 450 eV and 550 eV, preferably between 475 eV and 525 eV, and most preferably at exactly 500 eV. The current density lies between 5 µA/cm² and 500 µA/cm², preferably between 30 µA/cm² and 60 µA/cm², and most preferably at exactly 500 µA/cm². The temperature of the substrate surface lies between RT and 400° C., and most preferably at exactly RT. The duration of treatment of the substrate surface amounts to more than 10 s, preferably more than 50 s, more preferably more than 100 s, and most preferably at exactly 120 s. The ion dose of the plasma lies between $10^{13}$ ions/cm²s and $10^{17}$ ions/cm²s, more preferably between $10^{14}$ ions/cm²s and $10^{16}$ ions/cm²s, and most preferably at exactly $1.5 \times 10^{15}$ ions/cm²s.

The quantification of the substrate surface before and after treatment according to the invention took place with the help of X-ray photoelectron spectroscopy (XPS).

The process according to the invention can especially be controlled as follows:

A first gas, especially forming gas, even more preferably comprising only one component, most preferably argon, is ionized in an ion source and accelerated by an acceleration unit onto a point of a substrate surface. By preferably using a broad-band ion beam, the ion beam covers especially the entire substrate. The first component either encounters a non-contaminated site on the substrate surface and is elastically scattered (and therefore does not cause any modification/damage to the substrate surface, and thereby does not lead to a physical and/or chemical change); or, in the second conceivable case, the first component encounters an impurity. The bond energy between the impurity and the substrate surface is, according to the invention, especially many times over, set lower than the energy necessary to change the substrate surface itself. Alternatively or additionally, the bond energy between the impurity and the substrate surface is set smaller, especially many times over, than the kinetic energy of the first component. This component is therefore capable of removing the impurity from the substrate surface without damaging the substrate surface itself. In a second step according to the invention, a second gas, especially a forming gas, even more preferably comprising only one component, preferably hydrogen, is used to convert the sputtered-away impurity in the atmosphere into a less harmful compound that does not deposit so easily on the substrate surface any more. This compound is preferably a compound that exists in a gaseous state in the appropriate environment, and can therefore be carried out of the process chamber. The gas generated in the ion source can, in a special embodiment, be identical to the second gas that converts the impurities into a less harmful compound that does not deposit so easily on the substrate surface any more.

Further, a system according to the invention is disclosed, with whose help the method according to the invention can be applied as efficiently as possible. The system according to the invention comprises at least one ion source, at least one process chamber, at least one valve to channel a working gas into the working chamber, as well as a substrate sample holder for fixing and especially moving the substrate. The system according to the invention is preferably part of a cluster; more preferably part of a high-vacuum cluster, and most preferably part of an ultra-high-vacuum cluster. The pressure in one of the vacuum clusters named is especially less than 1 bar, preferably less than $10^{-1}$ mbar, more preferably less than $10^{-3}$ mbar, most preferably less than $10^{-5}$ mbar, and most preferably of all less than $10^{-8}$ mbar. In an especially preferred embodiment, the system according to the invention is, above all, used together with a bonder and/or an aligner to bond substrates with each other.

Further, a substrate is disclosed as a product according to the invention, which product is characterized by an extremely high surface purity and a very nominally damaged surface area. The surface purity is thereby preferably specified by the ratio of impurity atoms to number of substrate surface atoms. The surface purity is thus a dimensionless ratio. Preferably, this very small number is therefore given in ppm (parts per million), ppb (parts per billion), or ppt (parts per trillion). Before the cleaning process according to the invention, the impurities can cover the entire substrate surface, whereby the surface purity defined above would be greater than or equal to 1. By using the method according to the invention, this surface purity is reduced accordingly. The impurities of the substrate surface are, after the use of the method according to the invention, less than 1 ($10^6$ ppm), preferably less than $10^{-3}$ (1000 ppm), more preferably less than $10^{-6}$ (1 ppm), most preferably less than $10^{-9}$ (1 ppt), especially preferably 0.

The intensity of the damage is best indicated by the depth range inside of which a change in the microstructure of the substrate is still detectable. This depth range is, owing to the use of the method and system according to the invention, less than 10 μm, preferably less than 1 μm, more preferably less than 100 nm, most preferably less than 10 nm, most preferably of all less than 1 nm, and especially most preferably, however, zero. Thus in the ideal case, absolutely no damage takes place due to the ion bombardment. The detection of such damage can be done by comparing the microstructures of the surface or the near-surface areas of a first substrate that has been treated with the method according to the invention with the microstructure of the surface or the near-surface areas of a second substrate that has not been treated with the method according to the invention, but that preferably comes from the same batch. The microstructure is thereby preferably examined with TEM (transmission electron microscopy) and/or AFM (atomic force microscopy) and/or SEM (scanning electron microscopy) and/or X-ray scattering and/or electron scattering.

BRIEF DESCRIPTION OF THE DRAWINGS

Further advantages, features, and details of the invention will become clear from the following description of preferred embodiment examples with the aid of the drawings.

In the figures, equal or effectively equal features are labelled with the same reference signs.

DETAILED DESCRIPTION OF THE INVENTION

Figure 1:
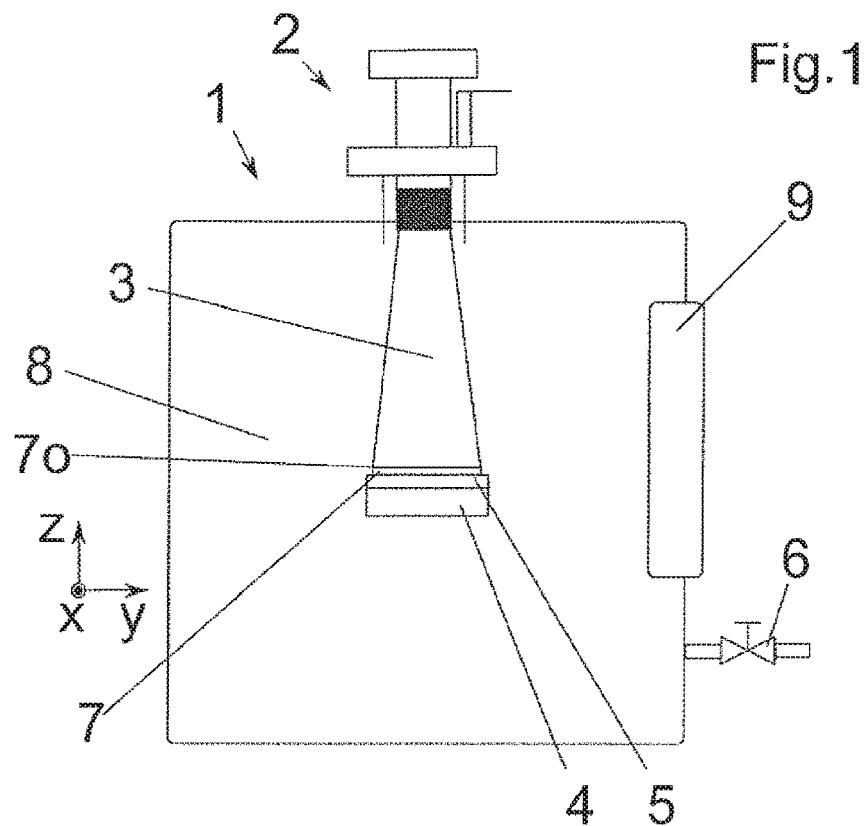
FIG. 1 shows a schematic depiction of a first embodiment according to the invention.

FIG. 1 shows a first, preferred embodiment according to the invention, comprising an ion sputtering system 1 with an ion source 2 that generates an ion beam 3, especially a broad-band ion beam. This beam encounters the substrate surface 7o of a substrate 7, which has been secured on a substrate sample holder 5. The substrate sample holder 5 has been secured on a table 4 and is preferably exchangeable. The substrate 7 can, by means of a robot, be loaded via a gate 9 into the process chamber 8. The process chamber 8 can be evacuated and/or flushed with a process gas via a valve 6. Because the table 4 is capable of translational and/or rotational movement in the direction of x and/or y and/or z or about the x- and/or y- and/or z-axis, the substrate surface 7o can be arranged in any arbitrary position and orientation with regard to the ion beam 3.

The process gas is preferably the same forming gas that is used by the ion source 2 to generate the ion beam 3.

Figure 2:
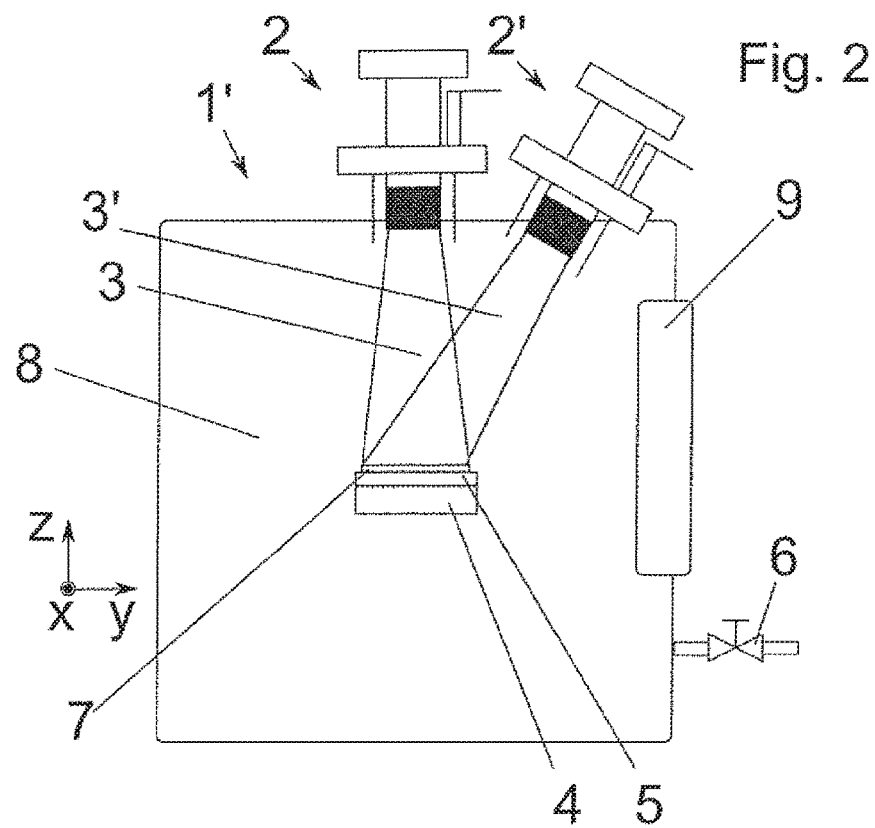
FIG. 2 shows a schematic depiction of a second embodiment according to the invention.

FIG. 2 shows a second embodiment, expanded by a second ion source 2'. The second ion source 2' can either be used to introduce a second forming gas into the process chamber 8 or ensures the targeted manipulation of the ion beam 3 via the ion beam 3'. It would be conceivable, for example, to manipulate the ion density in the ion beam 3 by means of the ion beam 3' by generating a second ion gas in the second ion source 2' that reduces or oxidizes the ions in the ion beam 3 of the first ion source 2. It is also conceivable for the ion source 2' to be an electron source, with whose help electrons are shot at the ion beam 3. The electrons of the ion beam 3' then reduce the positively charged ions of the ion beam 3. By means of high ion densities, an increase in the oxidation level of the ions of the ion beam 3 can occur; the ions are therefore more negatively charged.

Figure 3:
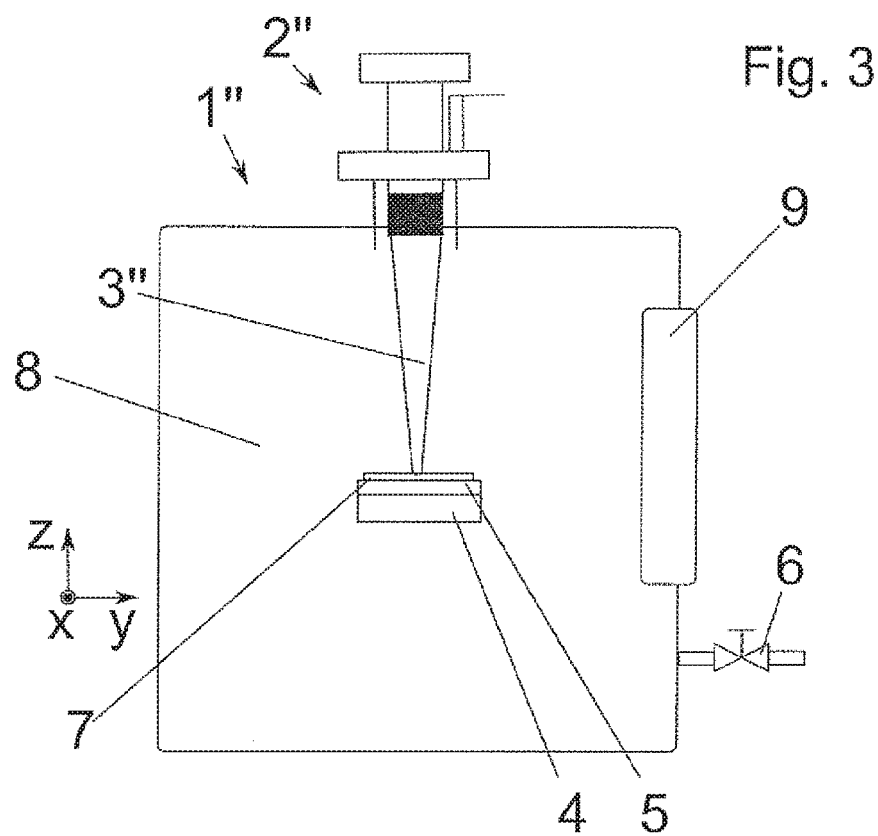
FIG. 3 shows a schematic depiction of a third embodiment according to the invention.

FIG. 3 shows a third embodiment according to the invention, similar to FIG. 1, in which an ion source 2" uses a narrow-band ion beam 3", in order to perform the cleaning of the substrate surface 7o according to the invention. In order to reach all desired points on the substrate surface 7o, the substrate sample holder 5 with the substrate 7 is moved relative to the ion beam 3". The use of at least one further ion source 2' is conceivable in this embodiment as well.

Figure 4:
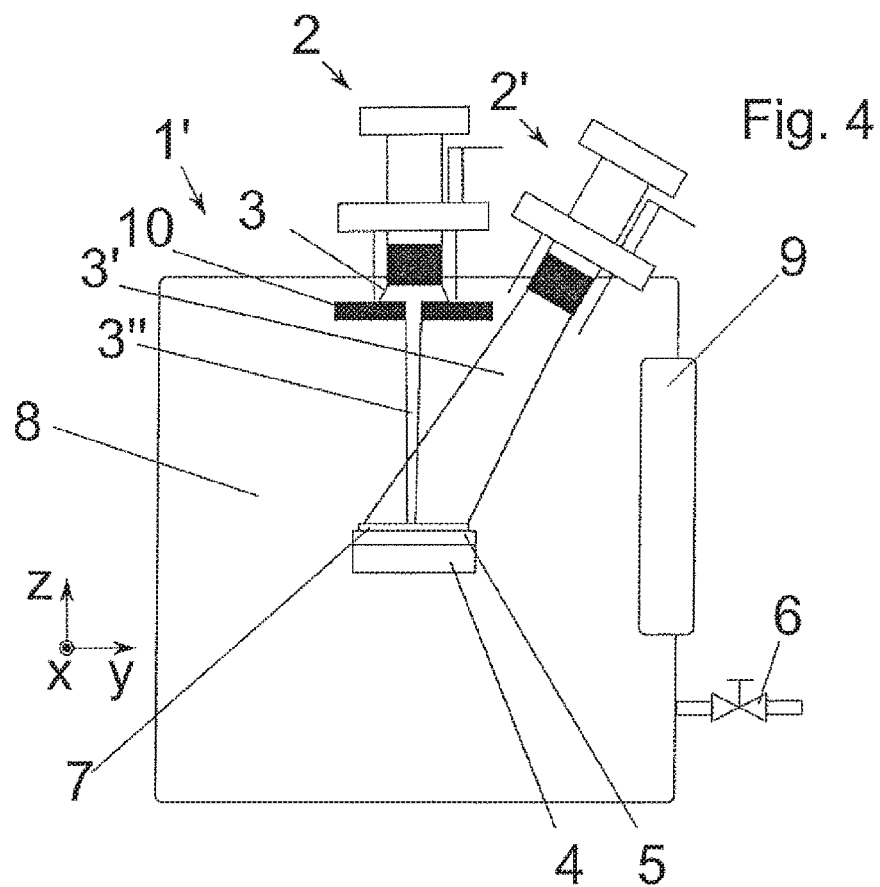
FIG. 4 shows a schematic depiction of a fourth embodiment according to the invention.

FIG. 4 shows a fourth embodiment according to the invention, similar to FIGS. 2 and 3, in which the one ion source 2 generates a broad-band ion beam 3 above an aperture 10. The aperture 10 converts the broad-band ion beam 3 into a narrow-band ion beam 3". In this embodiment according to the invention, the second ion source 2' not only serves to manipulate the ion beam 3", but also binds especially preferably above all impurities that detach from the aperture 10. These impurities would otherwise deposit on the substrate 7 and contaminate it. Because the combination depicted in FIG. 4 of an ion source 2, a broad-band ion beam 3, and an aperture 10 is often used to generate corresponding narrow-band ion beams 3", this embodiment according to the invention possesses appropriately high technical and economic relevance. The aperture 10 is especially made of carbon or carbon-containing material and is thus correspondingly greatly involved in an especially organic pollution of the substrate 7. By using the embodiment according to the invention, however, and with the help of the second ion source 2', especially configured as an ion gun, and/or the forming gas introduced, depositing of the impurities by the aperture 10 can be mostly prevented or even completely ruled out. The ion beam 3' of the second ion source 2' can, with an appropriate positioning of the aperture 10, also be employed between the aperture 10 and the first ion source 2, meaning in the area of the broad-band ion beam 3. In an exceptionally preferred embodiment, the ion source 2' can be pivoted such that the ion beam 3' can be employed both above and below the aperture 10. The ion beam 3' can, of course, also be further used to clean the substrate surface 7o. In order to reach all desired points on the substrate surface 7o, the substrate sample holder 5 can again be moved with the substrate 7 relative to the ion beam 3".

Figure 5:
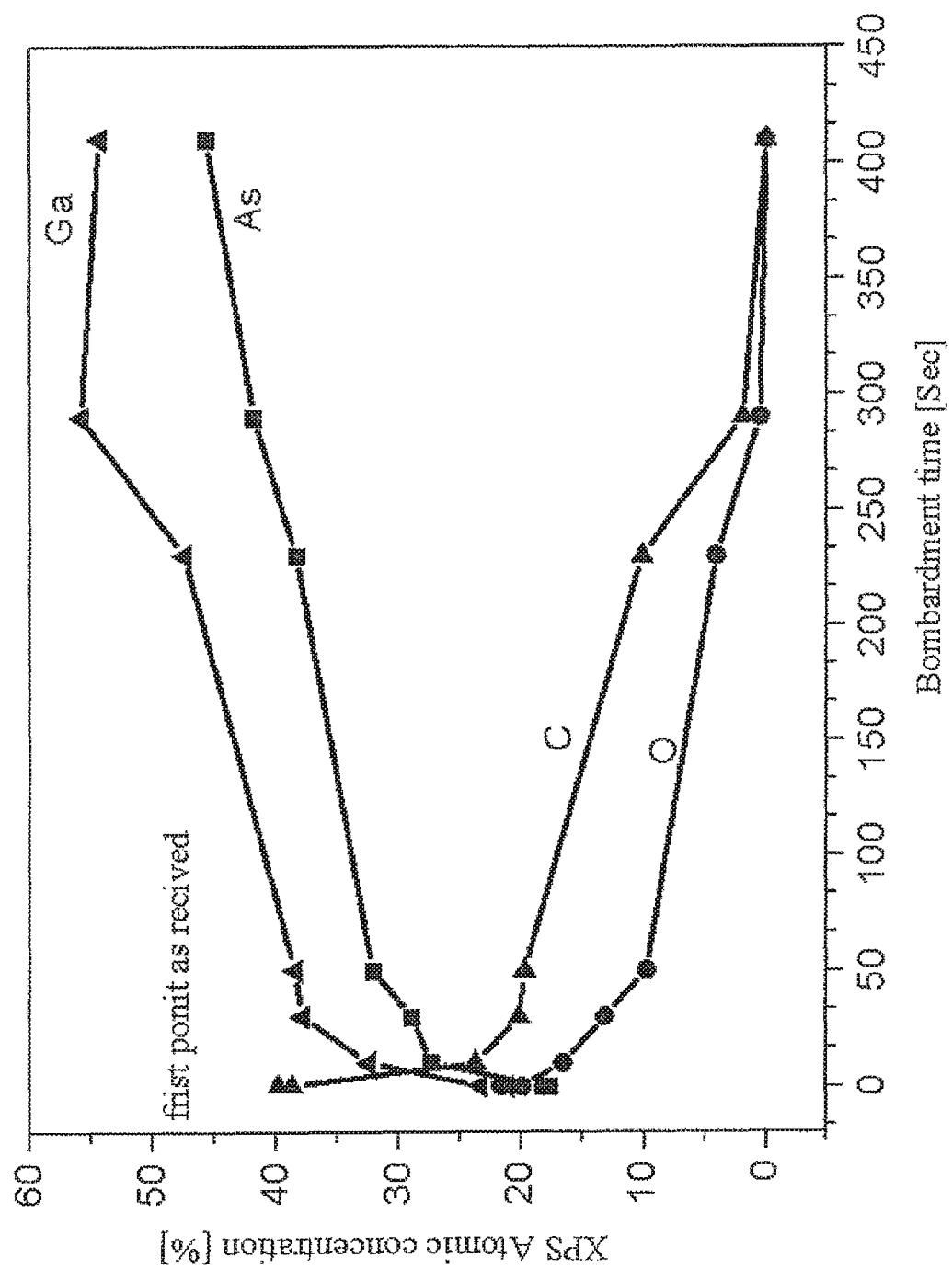
FIG. 5 shows a scientific diagram of the concentration dependence of multiple atoms on treatment time.

FIG. 5 shows a scientific diagram of an XPS (X-ray photoelectron spectroscopy) measurement, in which the atomic concentrations of gallium, arsenic, carbon, and oxygen on a GaAs substrate surface 7o are depicted as a function of bombardment time with the forming gas mixture according to the invention and the ion sputtering system according to the invention. The decrease in oxygen and carbon concentrations and the associated increase in gallium and arsenic concentrations are distinctly discernable. Note that the cleaning process presented here makes possible such results at extremely low temperatures and in a very short amount of time, as well as without any noteworthy damage to the substrate surface. In particular, "noteworthy damage" is understood to mean a change in the microstructure inside of a depth range. The depth range is especially less than 15 nm, preferably less than 7 nm, more preferably less than 3 nm, and most preferably less than 1.5 nm.

Figure 6A:
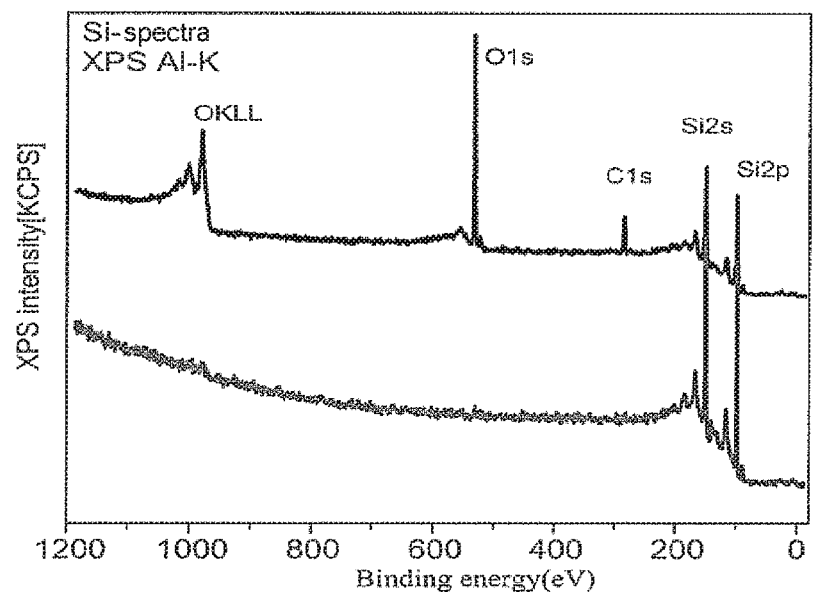
FIG. 6a shows a scientific diagram of the intensity dependence of an XPS signal on the wavelength for the material silicon.
Figure 6B:
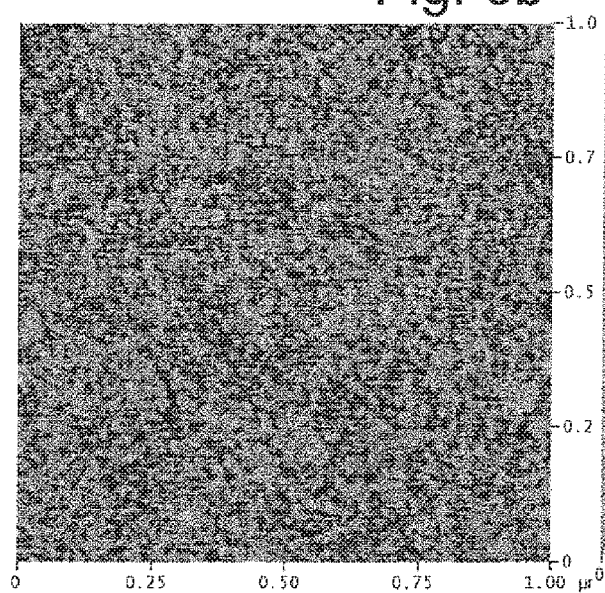
FIG. 6b shows a microscopic surface image of a substrate surface before the treatment according to the invention.
Figure 6C:
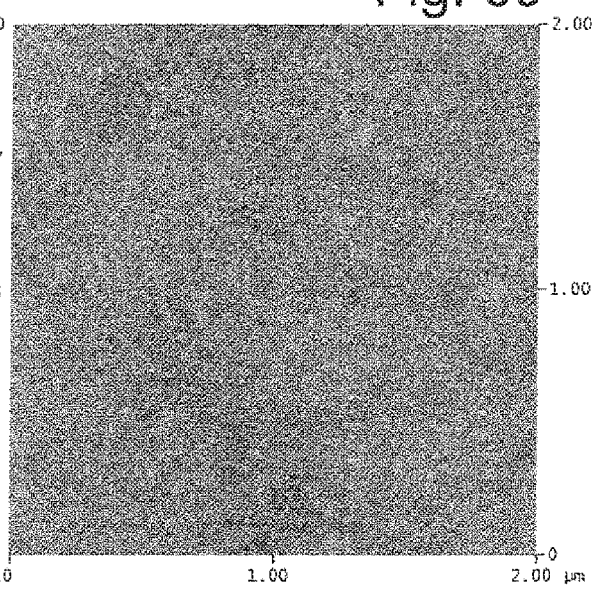
FIG. 6c shows a microscopic surface image of a substrate surface after the treatment according to the invention.

FIG. 6a shows a scientific diagram of an XPS (X-ray photoelectron spectroscopy) measurement of two intensity spectra. The upper intensity spectrum shows the existence of oxygen and carbon as well as silicon through characteristic intensity profiles. In the lower intensity spectrum, recorded after the cleaning of the silicon surface according to the invention, the characteristic oxygen and carbon profiles have disappeared. FIGS. 6b and 6c show an AFM (atomic force microscopy) recording of the substrate surface under examination before and after the use of the methods according to the invention. The reduction of roughness via removal of carbon impurities as well as the removal of the oxide is clearly discernable. Despite the use of ion sputtering technology, the method according to the invention did not, therefore, lead to a roughening of the surface, but rather eradicated the impurities and optimally prepared the substrate surface for a further process step.

Figure 7:
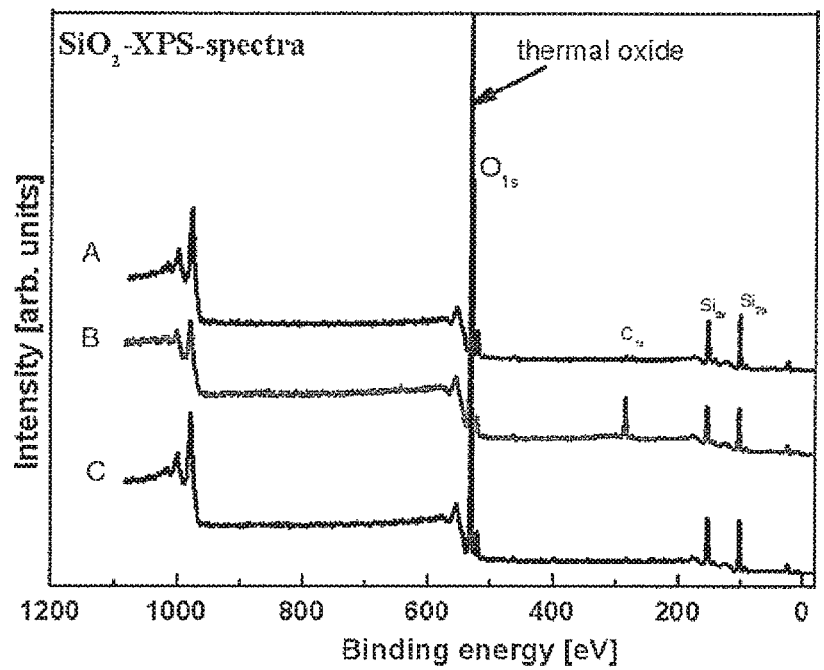
FIG. 7 shows a scientific diagram of the intensity dependence of an XPS signal on the wavelength for the material silicon oxide.

FIG. 7 shows a scientific diagram of an XPS (X-ray photoelectron spectroscopy) measurement of three intensity spectra. The upper intensity spectrum shows the existence of carbon as well as oxygen of the silicon dioxide. In a first trial, attempts were made to remove the carbon using pure argon. After ion bombardment with pure argon, the second intensity profile (in the middle) was recorded. In the second intensity profile, an increase in the carbon concentration is distinctly discernable. The increase in carbon concentration can have many causes. It is nevertheless important that the carbon comes from the process chamber 8. It has accumulated there, has deposited on the walls, was introduced via parts of the ion sputtering system, or was introduced through the gate. Only a processing according to the invention of the substrate surface 7o by using the technique according to the invention in conjunction with the forming gas according to the invention yields a substrate surface that has been rid of carbon, as is visible in the third (the lower) intensity profile from the absence of the carbon profile at the same wavelength.

Figure 8:
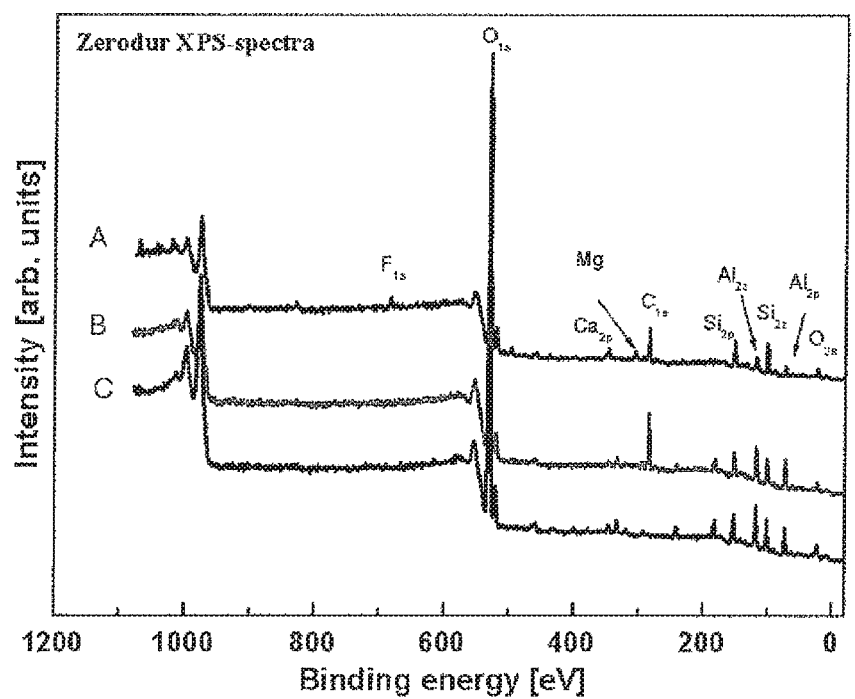
FIG. 8 shows a scientific diagram of the intensity dependence of an XPS signal on the wavelength for the material Zerodur.

Analogous considerations apply to the trials carried out on Zerodur according to FIG. 8.

Figure 9:
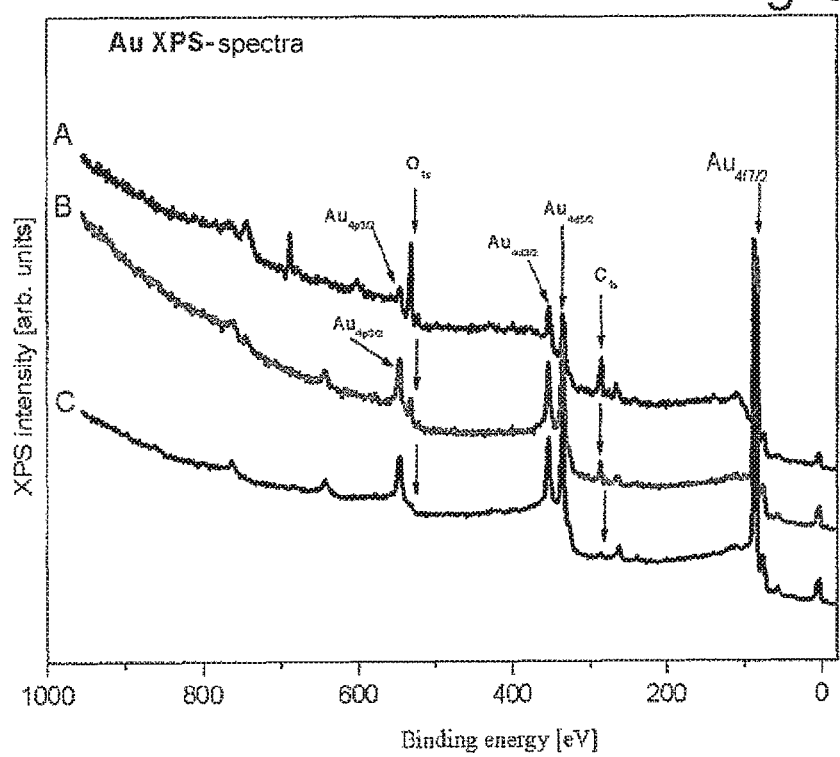
FIG. 9 shows a scientific diagram of the intensity dependence of an XPS signal on the wavelength of the material gold.

FIG. 9, in conclusion, shows the removal of carbon on a gold surface. This shows that the system and method according to the invention are also optimally suited for cleaning metal surfaces. With special preference, the method according to the invention can also be used to clean metal surfaces like copper in order to bond these in a further process step.

REFERENCE SIGN LIST

1 Ion sputtering system
2, 2', 2" Ion source
3, 3', 3" Ion beam
4 Table
5 Substrate sample holder
6 Valve
7 Substrate
7o Substrate surface
8 Process chamber
9 Gate
10 Aperture Having described the invention, the following is claimed:

1. A method for the surface treatment of a substrate surface of a substrate, the method comprising:
arranging the substrate surface in a process chamber;
bombarding the substrate surface with an ion beam to remove impurities from the substrate surface, the ion beam having an ion energy <1000 eV and a first component, the ion beam being generated and aimed at the substrate surface by an ion beam source; and
introducing a second component into the process chamber to bind the removed impurities,
wherein a change in a microstructure of the substrate caused by the bombarding of the substrate surface is within a depth range of the substrate, the depth range of the substrate being less than 10 μm.

2. The method according to claim 1, wherein the depth range is less than 15 nm.

3. The method according to claim 1, wherein the depth range is less than 1.5 nm.

4. The method according to claim 1, wherein a temperature of the process chamber is less than 100° C.

5. The method according to claim 1, wherein a temperature of the process chamber is room temperature.

6. The method according to claim 1, further comprising:
verifying the microstructural change within the depth range via transmission electron microscopy, atomic force microscopy, scanning electron microscopy, X-ray scattering, electron scattering, or a combination thereof.

* * * * *